(12) United States Patent
Nakagawa et al.

(10) Patent No.: US 6,958,504 B2
(45) Date of Patent: Oct. 25, 2005

(54) SEMICONDUCTOR STORAGE DEVICE AND METHOD OF MANUFACTURING THE SAME

(75) Inventors: Takashi Nakagawa, Kanagawa (JP); Takashi Hase, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/862,381

(22) Filed: Jun. 8, 2004

(65) Prior Publication Data

US 2004/0253746 A1 Dec. 16, 2004

(30) Foreign Application Priority Data

Jun. 10, 2003 (JP) ........................................ 2003-165191

(51) Int. Cl.$^7$ .............................................. H01L 29/76
(52) U.S. Cl. ...................................... 257/295; 257/310
(58) Field of Search .......................... 257/43, 295, 296, 257/310

(56) References Cited

U.S. PATENT DOCUMENTS

| | | | |
|---|---|---|---|
| 5,838,035 A | * | 11/1998 | Ramesh ....................... 257/295 |
| 6,392,257 B1 | * | 5/2002 | Ramdani et al. ............. 257/190 |
| 6,518,609 B1 | * | 2/2003 | Ramesh ....................... 257/295 |
| 6,563,118 B2 | * | 5/2003 | Ooms et al. .................. 257/43 |

FOREIGN PATENT DOCUMENTS

| | | |
|---|---|---|
| JP | 2000-58525 | 2/2000 |
| JP | 2002-334875 | 11/2002 |

* cited by examiner

*Primary Examiner*—Chandra Chaudhari
(74) *Attorney, Agent, or Firm*—McGinn & Gibb, PLLC (57) ABSTRACT

A method of manufacturing a semiconductor storage device having a capacitive element having a dielectric layer having a perovskite-type crystal structure represented by general formula $ABO_3$ and a lower electrode and an upper electrode disposed so as to sandwich the dielectric layer therebetween; in the method are carried out forming, on a lower electrode conductive layer, using a MOCVD method, an initial nucleus containing at least one metallic element the same as a metallic element in the dielectric layer, forming, on the initial nucleus, using a MOCVD method, a buffer layer containing at least one metallic element the same as the metallic element contained in both the initial nucleus and the dielectric layer, in a higher content than the content of this metallic element contained in the initial nucleus, and forming, on the buffer layer, using a MOCVD method, the dielectric layer having a perovskite-type crystal structure.

9 Claims, 4 Drawing Sheets

SEMICONDUCTOR STORAGE DEVICE AND METHOD OF MANUFACTURING THE SAME

BACKGROUND OF THE INVENTION

1. Field of the Invention

The present invention relates to a semiconductor storage device having capacitive elements and a method of manufacturing the semiconductor storage device, and in particular relates to a method of forming a dielectric film using a metal organic chemical vapor deposition method.

2. Description of a Related Art

In recent years, research and development has been carried out with vigor into ferroelectric memories that utilize the polarization characteristics of a ferroelectric, DRAMs that use a high-dielectric-constant material, and so on.

As methods of forming a film of a ferroelectric or a high-dielectric-constant material, conventionally a sol-gel method, a sputtering method, a CVD method and so on have been used. Of these methods, the CVD method is superior in terms of the uniformity of film formation over a large-diameter wafer and the ability to cover over steps on the surface, and hence is promising as an ULSI mass production technique.

As methods of forming a film of a ferroelectric or a high-dielectric-constant material using such a CVD method, in particular a metal organic chemical vapor deposition (MOCVD) method, the following methods have been disclosed.

Japanese Unexamined Patent Application Publication No. 2000-58525 discloses a vapor phase deposition method for a metal oxide dielectric film (in particular a PZT film) having a perovskite-type crystal structure represented by general formula $ABO_3$, the deposition method having a step of forming an initial nucleus or initial layer having a perovskite-type crystal structure on a conductive material under first film formation conditions, and a step of further forming a film having a perovskite-type crystal structure on the initial nucleus or initial layer under second film formation conditions. Furthermore, it is stated that the raw material supply amounts for the constituent elements are changed between the first film formation conditions and the second film formation conditions. Moreover, it is disclosed that according to this method, the film formation can be carried out at a low temperature (450° C. or less) so as not to cause degradation of plugs, wiring and transistors in a lower layer, and moreover a metal oxide dielectric film having excellent orientation and crystallinity can be formed.

Japanese Unexamined Patent Application Publication No. 2002-334875 discloses a vapor phase deposition method for a metal oxide dielectric film (in particular a PZT film) having a perovskite-type crystal structure represented by general formula $ABO_3$, the deposition method having a step of forming an initial nucleus or initial amorphous layer having a perovskite-type crystal structure on a conductive material under first film formation conditions, and a step of further forming a film having a perovskite-type crystal structure on the initial nucleus or initial amorphous layer under second film formation conditions, and characterized in that here the first film formation conditions satisfy at least one of the substrate temperature being lower than for the second film formation conditions and the raw material gas pressure being higher than for the second film formation conditions. Furthermore, it is stated that according to this method, a dielectric film is formed for which the leakage current is low and moreover the transparency is excellent and hence mask alignment can be carried out well, and furthermore if this dielectric film is used in a capacitive element then a semiconductor device having little variation in bit line voltage difference can be manufactured.

However, with the method of forming a dielectric film using the MOCVD method having two steps as in the conventional art described above, there have been calls for further improvements with regard to the capacitance characteristics of the element formed.

SUMMARY OF THE INVENTION

In view of the foregoing, it is an object of the present invention to provide a semiconductor storage device having capacitive elements for which capacitance characteristics, in particular low voltage characteristics, are improved, and a method of manufacturing the semiconductor storage device.

To these ends, according to one aspect of the present invention, there is provided a method of manufacturing a semiconductor storage device having a capacitive element having a dielectric layer having a perovskite-type crystal structure represented by general formula $ABO_3$ and a lower electrode and an upper electrode disposed so as to sandwich the dielectric layer therebetween, the method comprising forming, on a conductive layer constituting the lower electrode, using a MOCVD method, an initial nucleus containing at least one metallic element the same as a metallic element in the dielectric layer; forming, on the initial nucleus, using a MOCVD method, a buffer layer containing at least one metallic element the same as the metallic element contained in both the initial nucleus and the dielectric layer, in a higher content than the content of this metallic element contained in the initial nucleus; and forming, on the buffer layer, using a MOCVD method, the dielectric layer having a perovskite-type crystal structure.

According to another aspect of the present invention, there is provided a semiconductor storage device having a capacitive element having a dielectric layer having a perovskite-type crystal structure represented by general formula $ABO_3$ and a lower electrode and an upper electrode disposed so as to sandwich the dielectric layer therebetween, the semiconductor storage device having, on conductive layer constituting the lower electrode, an initial nucleus containing at least one metallic element the same as a metallic element in the dielectric layer; and between the initial nucleus and the dielectric layer, a buffer layer containing at least one metallic element the same as the metallic element contained in both the initial nucleus and the dielectric layer, in a higher content than the content of this metallic element contained in the initial nucleus.

The present invention thereby provides a semiconductor storage device having capacitive elements for which the capacitance characteristics, in particular the low voltage characteristics, are improved.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Preferred embodiments of the present invention will be described hereinafter with reference to the drawings.

The present invention relates to the formation of a dielectric layer of a capacitive element using a metal organic chemical vapor deposition (MOCVD) method, and is principally characterized by forming, on a conductive layer, an initial nucleus containing at least one metallic element the same as a metallic element in the dielectric layer, and then providing, on the initial nucleus, a buffer layer containing at least one metallic element the same as the metallic element contained in both the initial nucleus and the dielectric layer, in a higher content than the content of this metallic element contained in the initial nucleus, and forming the dielectric layer on the buffer layer. The present invention can provide a semiconductor storage device having capacitive elements for which the capacitance characteristics, in particular the low voltage characteristics, are improved.

The present invention is effective in the case that a dielectric containing a metallic element that evaporates relatively easily under the temperature and pressure conditions in the film formation process, i.e. a metallic element having a high vapor pressure (hereinafter referred to as a 'high-vapor-pressure metallic element'), in particular a dielectric containing lead (Pb) (hereinafter referred to as a 'Pb-based dielectric), is used as the material of the dielectric layer.

Conventionally, when forming a dielectric layer of a capacitive element, to improve the orientation and crystallinity and the inversional fatigue resistance, a first step of forming an initial nucleus on a conductive layer, and a second step of forming a dielectric layer having a perovskite-type crystal structure on the initial nucleus have been carried out. The inventors of this invention carried out assiduous studies from the viewpoint of improving the capacitance characteristics, and as a result discovered that with this method there are the following problems. That is, the film formation conditions (raw material supply content, temperature, pressure, etc.) differ between the first step and the second step, and hence when switching the film formation conditions between the first step and the second step, a waiting period is required until the film formation conditions stabilize at the prescribed conditions for the second step. Consequently, when forming a dielectric layer containing a high-vapor-pressure metallic element as described above as the dielectric layer, in the case of forming an initial nucleus containing a metallic element the same as the high-vapor-pressure metallic element, depending on the length of the waiting period and the various conditions, the high-vapor-pressure metallic element is prone to evaporating, causing a defect at the surface of the initial nucleus. If stoichiometric defects at the surface of the initial nucleus become marked, then there will be an adverse effect on the crystal orientation of the dielectric layer formed thereupon, and this worsening of the crystal orientation and the stoichiometric defects will cause a worsening of the capacitance characteristics.

The present invention thus aims at providing a semiconductor storage device having capacitive elements with improved capacitance characteristics by providing, on the initial nucleus, a buffer layer that contains a metallic element the same as a high-vapor-pressure metallic element contained in the initial nucleus, wherein the content of this metallic element in the buffer layer is greater than the content of the same contained in the initial nucleus, thus filling defects, and then providing a dielectric film on the buffer layer.

Following is a description of each of the constituent elements of the capacitive element in the present invention.

[Electrodes]

In the present invention, as a lower electrode and upper electrode that are disposed so as to sandwich the dielectric layer therebetween, electrodes having platinum (Pt), iridium (Ir), iridium oxide ($IrO_2$), ruthenium (Ru), ruthenium oxide (RuO, $RuO_2$), gold (Au), titanium nitride (TiN) or the like as a principal component thereof can be used. These electrodes can be formed using CVD, sputtering, vacuum deposition or the like. In the present invention, the lower electrode and the upper electrode preferably each have, at least on a surface on the dielectric layer side, a film comprising at least one material selected from platinum (Pt), iridium (Ir), ruthenium (Ru), and oxides thereof.

[Initial Nucleus]

In the present invention, the initial nucleus is provided on the conductive layer constituting the lower electrode, and contains at least one metallic element the same as a metallic element in the subsequently formed dielectric layer. By forming the dielectric layer after providing such an initial nucleus, compared with the case that the dielectric layer is provided directly on the conductive layer, a dielectric layer having better orientation, crystallinity, and inversional fatigue resistance can be formed. From the viewpoint of obtaining yet better characteristics, the initial nucleus is preferably a crystalline nucleus comprising an element A, element B and oxygen, and more preferably has a perovskite-type crystal structure represented by general formula $ABO_3$.

Regarding the constituent elements of the initial nucleus, the initial nucleus may contain all of the same metallic elements as the metallic elements in the subsequently formed dielectric layer, or may contain one or some of these metallic elements. From the viewpoint of the controllability of the film formation conditions, the crystallinity and so on, the metallic elements in the initial nucleus are preferably selected from the metallic elements in the dielectric layer. For example, in the case that the subsequently formed dielectric layer is to be a PZT layer (containing Pb as element A, and Zr and Ti as elements B, the initial nucleus is preferably a PZT layer or a lead titanate (PTO) layer, and from the viewpoint of the controllability of the film formation conditions, the crystallinity and so on, is particularly preferably a PTO layer.

From the viewpoint of the capacitance characteristics, the ratio B/A of the element B to the element A in the initial nucleus (in the case of lead titanate, Ti/Pb) is preferably at least 0.5, more preferably at least 0.8, and on the other hand is preferably not more than 1.5, more preferably not more than 1.2, and is particularly preferably in a range of 0.9 to 1.1.

In the present invention, the initial nucleus may be made to be a continuous film covering the whole of the upper surface of the lower electrode, but from the viewpoint of suppressing a bias in the electric field and a drop in the dielectric constant, and the controllability of the crystal grain size, the initial nucleus preferably comprises a plurality of islands formed at high density. Moreover, from the viewpoint of the capacitance characteristics and so on, the thickness of the initial nucleus is preferably at least 1 nm, more preferably at least 2 nm, and on the other hand is preferably not more than 10 nm.

The processing time in the formation of the initial nucleus (first step) can be set as appropriate from, for example, a range of 5 to 60 seconds. If the processing time is too short or too long, then it will become difficult to obtain a dielectric film having the desired characteristics.

[Buffer Layer]

In the present invention, the buffer layer is provided on the initial nucleus that has been provided on the conductive layer constituting the lower electrode, and the dielectric film is provided on this buffer layer. The buffer layer must contain at least one metallic element the same as a metallic element contained in both the initial nucleus and the dielectric layer, in a higher content than the content of this metallic element contained in the initial nucleus. It is preferable for the content of at least a high-vapor-pressure metallic element contained in the buffer layer to be greater than the content of the same contained in the initial nucleus.

In a film formation process using the MOCVD method, in the case that the initial nucleus contains a high-vapor-pressure metallic element, if the waiting period between the step of forming the initial nucleus and the step of forming the dielectric layer is long, then this high-vapor-pressure metallic element will be prone to evaporating from the surface of the initial nucleus, causing a defect. Stoichiometric defects due to this defect may cause a worsening of the capacitance characteristics. With the present invention, a buffer layer that contains this high-vapor-pressure metallic element which is likely to cause a defect in a higher content than in the initial nucleus is provided on the initial nucleus, and then the dielectric film is formed. As a result, compared with the case that such a buffer layer is not provided, the capacitance characteristics, in particular the low voltage characteristics, can be improved.

From the viewpoint of the capacitance characteristics, the waiting period between the step of forming the initial nucleus and the step of forming the buffer layer, and the ease of operation, it is preferable for a metallic element in the buffer layer to be selected from the metallic elements in the initial nucleus. Moreover, from the viewpoint of the device characteristics, the buffer layer preferably contains at least one of the element A and one of the element B. For example, in the case that the initial nucleus contains lead (Pb), it is preferable for the buffer layer to contain Pb, and for the Pb content in the buffer layer to be greater than that in the initial nucleus. In the case that the dielectric layer comprises PZT and the initial nucleus comprises lead titanate, the buffer layer can be constituted from lead titanate or lead oxide. From the viewpoint of the capacitance characteristics, lead titanate is more preferable.

The content of a metallic element for which one wishes to prevent loss from the surface of the initial nucleus, in particular the content of a high-vapor-pressure metallic element, in the buffer layer can be set as appropriate from within a range higher than the content of the same in the initial nucleus. If the content of this metallic element in the buffer layer is too low, then the desired capacitance characteristic improvement effect will no longer be obtained. Conversely, if this content is too high, then the capacitance characteristic improvement effect will tend to drop. In the case of forming, for example, lead titanate as the initial nucleus, by forming lead oxide as the buffer layer, a capacitance characteristic improvement effect can be obtained. Moreover, in the case of forming lead titanate as the initial nucleus and the buffer layer, if the Ti/Pb ratio in the initial nucleus is around 1, for example 0.8 to 1.2, more preferably 0.9 to 1.1, then by setting the Ti/Pb ratio in the buffer layer to be within a range of, for example, 0.2 to 1, more preferably 0.4 to 0.8, a higher capacitance characteristic improvement effect can be obtained.

The thickness of the buffer layer is preferably at least 0.2 nm, more preferably at least 0.4 nm, yet more preferably at least 1 nm, and on the other hand is preferably not more than 10 nm, more preferably not more than 8 nm, yet more preferably not more than 5 nm. If the buffer layer is too thin, then it will no longer be possible to obtain a sufficient capacitance characteristic improvement effect. Conversely, if the buffer layer is too thick, then the influence of the buffer layer on the crystal orientation of the dielectric layer formed thereon will become large, and hence the capacitance characteristics may worsen. The buffer layer thus preferably has a thickness such as not to exert an influence on the crystal orientation of the dielectric layer.

For the buffer layer, two or more layers may be built up on top of one another; in this case, the layers can be built up so that the content of the high-vapor-pressure metallic element such as Pb becomes progressively greater from the side of the lower electrode toward the dielectric layer. Moreover, the buffer layer may be a layer having a composition distribution such that the content of the high-vapor-pressure metallic element in the dielectric layer increases continuously from the side of the lower electrode toward the dielectric layer.

[Dielectric Layer]

In the present invention, the dielectric layer has a perovskite-type crystal structure represented by general formula $ABO_3$ and is provided on the buffer layer; the upper electrode is provided on the dielectric layer. The thickness of the dielectric layer can be set as appropriate from within a range of, for example, 50 to 500 nm.

In the present invention, the dielectric layer preferably comprises a dielectric containing Pb as an element A (a Pb-based dielectric), with a ferroelectric having a perovskite-type crystal structure containing lead (Pb) as an element A occupying the A lattice site and containing zirconium (Zr) and titanium (Ti) as elements B occupying the B lattice site (hereinafter referred to as 'PZT') being particularly preferable. As this PZT, one represented by the general formula $(Pb_{1-x}M_x)(Zr_yTi_{1-y})O_3$, wherein x and y are in the ranges $0 \leq x<1$ and $0<y<1$ respectively, can be used. An example of M in the formula is at least one selected from Nb, La, Li, Na, Mg, Ca, Sr, Ba and Bi. From the viewpoint of obtaining the desired device characteristics, it is preferable for x in the formula to be within the range $0 \leq x \leq 0.2$ and it is particularly preferable for x to be 0, i.e. for the dielectric to be one represented by general formula $Pb(Zr_yTi_{1-y})O_3$. From the viewpoint of obtaining the desired device characteristics, in particular suppressing the leakage current, y in the formula is preferably at least 0.3, more preferably at least 0.35, and on the other hand from the viewpoint of obtaining a sufficient remanent polarization, y is preferably not more than 0.8, more preferably not more than 0.7.

In accordance with the desired characteristics, the dielectric layer may be made to have a varying composition in the thickness direction, or may be made to comprise dielectric layers having different compositions built up on top of one another.

[Method of Forming Films by MOCVD]

Following is further description of the method of forming the initial nucleus, the buffer layer and the dielectric layer using MOCVD. The formation of these layers can be carried out using a publicly known vapor phase deposition apparatus for MOCVD.

The organometallic raw materials used in the MOCVD can be vaporized by being heated, and supplied into a vacuum vessel (deposition vessel) in which a substrate has been placed, if necessary together with a carrier gas. Organometallic raw materials are often solids or liquids at normal temperature and normal pressure. A solid raw material can be supplied using a solid sublimation method, or a liquid transport method in which the solid raw material is dissolved in a suitable solvent, the liquid is transported, and vaporization is carried out using a vaporizer immediately before introduction into the vacuum vessel. A liquid raw material can be supplied using the liquid transport method, either as is or if necessary after having been diluted using a solvent.

The vaporized raw materials (raw material gases) are supplied onto the substrate which has been heated to a prescribed temperature in the vacuum vessel which is held under reduced pressure, thus carrying out film formation. At this time, from the viewpoint of controlling the raw material gas composition content, the temperature of the inner walls of the vacuum vessel and the raw material supply system is preferably controlled to be at least a temperature at which the raw materials have a sufficient desorption velocity (vapor pressure) such as not to aggregate on the inner walls but less than a temperature at which the raw materials decompose. For example, this temperature can be set to approximately 180 to 220° C.

As the organometallic raw materials, for example in the case of PZT, lead bis-dipivaloylmethanate ($Pb(DPM)_2$) can be used for the Pb, titanium isopropoxide ($Ti(OiPr)_4$) or titanium diisopropoxy bis-dipivaloylmethanate ($Ti(OiPr)_2(DPM)_2$) can be used for the Ti, and zirconium butoxide ($Zr(OtBu)_4$) or zirconium isopropoxy tris-dipivaloylmethanate ($Zr(OiPr)(DPM)_3$) can be used for the Zr.

To prevent formation of an alloy or oxygen defects on the conductive layer constituting the lower electrode, it is preferable to supply in an oxidizing gas together with the organometallic raw material gases. Examples of this oxidizing gas are nitrogen dioxide ($NO_2$), ozone, oxygen, oxygen ions, and oxygen radicals; of these, nitrogen dioxide, which has high oxidizing ability, is preferable.

Further description will now be given, taking as an example the case of forming an initial nucleus and a buffer layer comprising lead titanate and a ferroelectric layer comprising PZT using these raw material gases.

First, a substrate on which a lower electrode conductive film has been formed is installed in the vacuum vessel. The pressure inside the vacuum vessel is then held at a prescribed reduced pressure, and the substrate temperature is held at, for example, not more than 450° C. The film formation conditions in the manufacturing method of the present invention do not necessarily have to be constant throughout the steps of forming the initial nucleus, the buffer layer and the ferroelectric film (the first, second and third steps); for example, as will be described later, it is possible to carry out the formation of the initial nucleus at a relatively low temperature, and carry out the formation of the dielectric layer at a temperature higher than the temperature for the formation of the initial nucleus, or carry out the formation of the initial nucleus at a relatively high pressure, and carry out the formation of the dielectric layer at a pressure lower than the pressure for the formation of the initial nucleus.

Next, the Pb raw material gas, the Ti raw material gas and the oxidizing gas are supplied at prescribed flow rates into the vacuum vessel for a prescribed time period, thus forming the initial nucleus on the substrate (first step). After that, the supply of the Pb raw material gas, the Ti raw material gas and the oxidizing gas is suspended.

When forming the initial nucleus, it is preferable to carry out a pretreatment step before this. For example, the Pb raw material gas is supplied at a prescribed flow rate into the vacuum vessel for a prescribed time period, and then while supplying in the Pb raw material gas the oxidizing gas is supplied in at a prescribed flow rate for a prescribed time period (pretreatment step), and then in this state supply of the Ti raw material gas is further commenced and this state is held for a prescribed time period, thus forming the initial nucleus on the substrate (first step). In the pretreatment step, the Pb raw material gas is supplied onto the conductive layer either alone or together with the oxidizing gas. By carrying out this pretreatment step, a dielectric layer having a small grain size and hence having only small surface roughness can be formed in the subsequent step of forming the dielectric layer, and as a result a dielectric layer having a low leakage current and excellent transparency can be formed. The pretreatment step must be carried out for a time period and under treatment conditions such that the Pb raw material gas decomposes on the surface of the conductive layer and is able to react sufficiently with the surface metal, but a PbO film is not formed on the conductive layer. For example, from the viewpoint of sufficiently obtaining the desired effects, the treatment temperature (the temperature of the conductive layer) is preferably at least 350° C., more preferably at least 390° C., but on the other hand from the viewpoint of suppressing PbO film formation and suppressing thermal degradation of aluminum wiring and the like, this treatment temperature is preferably not more than 700° C., more preferably not more than 600° C., yet more preferably not more than 450° C. The treatment time can generally be set as appropriate within a range of up to 60 seconds, for example 3 to 20 seconds. Note that PbO film formation can be investigated through X-ray diffraction.

Next, under flow rate conditions in which the flow rate ratio of the Pb raw material gas to the Ti raw material gas is greater than in the first step, for example supplying the Ti raw material gas at a lower flow rate than in the first step with the flow rates of the Pb raw material gas and the oxidizing gas being the same or substantially the same as in the first step, the buffer layer is formed (second step). At this time, if necessary, one or both of the temperature and the pressure may be changed relative to the first step. After a prescribed time period has passed, the supply of the Pb raw material gas, the Ti raw material gas and the oxidizing gas is suspended.

Next, changing the raw material supply conditions, the Pb raw material gas, the Zr raw material gas, the Ti raw material gas and the oxidizing gas are each supplied at a prescribed flow rate, and this state is held for a prescribed time period, thus forming a ferroelectric layer of a prescribed thickness (third step). At this time, if necessary, one or both of the temperature and the pressure may be changed relative to the previous steps. Note that when carrying out the third step, from the viewpoint of preventing Pb loss, it is preferable for the waiting period between the second step and the third step to be as short as possible. It is thus preferable for the conditions (temperature and pressure) in the second step to be as close as possible to those in the third step. As a result, the time period required for stabilization after changing the film formation conditions in preparation for the third step can be shortened, i.e. the waiting period can be shortened.

After the formation of the ferroelectric layer has been completed, a conductive layer for upper electrode formation is formed thereon by sputtering, CVD or the like.

[Film Formation Temperature and Pressure]

Throughout the first to third steps of the MOCVD in the manufacturing method of the present invention, from the viewpoint of crystallinity, the treatment temperature (the temperature of the conductive layer) is preferably at least 350° C., more preferably at least 370° C. On the other hand, from the viewpoint of the heat resistance of the materials and suppressing the leakage current, the treatment temperature is preferably not more than 700° C., and in particular, considering the heat resistance of plugs and wiring comprising a low-melting-point material such as aluminum and preventing thermal degradation of transistors, the treatment temperature is more preferably not more than 450° C. Moreover, throughout the first to third steps, from the viewpoint of the film formation rate, the total pressure of the raw material gases is preferably at least $1 \times 10^{-4}$ Torr ($1.33 \times 10^{-2}$ Pa). On the other hand, in the first step, from the viewpoint of the crystallinity, the total pressure can be set as appropriate from within a range of up to 100 Torr (13.3 kPa), for example can be made to be not more than 20 Torr (2.66 kPa). In the third step, from the viewpoint of the crystallinity, the total pressure is preferably made to be not more than 4 Torr (532 Pa), more preferably not more than 2 Torr (266 Pa). From the viewpoint of preventing loss of a high-vapor-pressure metallic element such as Pb, the waiting period between the second step and the third step is preferably as short as possible, and hence the treatment conditions (temperature and pressure) in the second step are preferably close to or the same as the treatment conditions in the third step, i.e. can be set as appropriate from within the ranges for the treatment conditions in the third step.

Moreover, in the manufacturing method of the present invention, the conditions in the first step preferably satisfy at least one of the temperature (the temperature of the conductive layer) being lower than in the third step (hereinafter referred to as the 'low temperature nucleus formation condition') and the raw material gas pressure being higher than in the third step (hereinafter referred to as the high pressure nucleus formation condition'). According to this method, the grain size of the subsequently formed dielectric layer is reduced, and hence surface roughness is reduced. As a result, a dielectric film for which the leakage current is reduced, and the transparency is excellent and hence mask alignment can be carried out well is formed, and moreover if such a dielectric film is applied to a capacitive element, then a semiconductor device having little variation in bit line voltage difference can be manufactured. Here, from the viewpoint of reducing loss of a high-vapor-pressure metallic element such as Pb, the waiting period between the second step and the third step is preferably as short as possible, and hence the conditions in the second step are preferably close to or the same as the conditions in the third step, i.e. can be set as appropriate from within the ranges for the treatment conditions in the third step.

Regarding the low temperature nucleus formation condition, it is preferable to set the temperature in the first step to be lower than the temperature in the third step, with these temperatures being within the following ranges. The pressures can be set within the previously mentioned pressure ranges, or may be set in accordance with the high pressure nucleus formation condition described below.

Temperature in first step: Preferably at least 350° C., more preferably at least 370° C.; on the other hand, preferably not more than 450° C., more preferably not more than 400° C.

Temperature in third step: Can be set as appropriate from within a range of 400 to 700° C.; preferably not more than 470° C., more preferably not more than 450° C.

Regarding the high pressure nucleus formation condition, it is preferable to set the pressure in the first step to be higher than the pressure in the third step, with these pressures being within the following ranges. The temperatures can be set within the previously mentioned temperature ranges, or can be set in accordance with the low temperature nucleus formation condition described above.

Pressure in first step: Preferably at least 0.1 Torr (13.3 Pa), more preferably at least 1 Torr (133 Pa); on the other hand, preferably not more than 100 Torr (13.3 kPa), more preferably not more than 20 Torr (2.66 kPa).

Pressure in third step: Preferably at least $1 \times 10^{-4}$ Torr ($1.33 \times 10^{-2}$ Pa); on the other hand, preferably not more than 4 Torr (532 Pa), more preferably not more than 2 Torr (266 Pa).

[Method of Manufacturing Semiconductor Storage Device]

Figure 1:
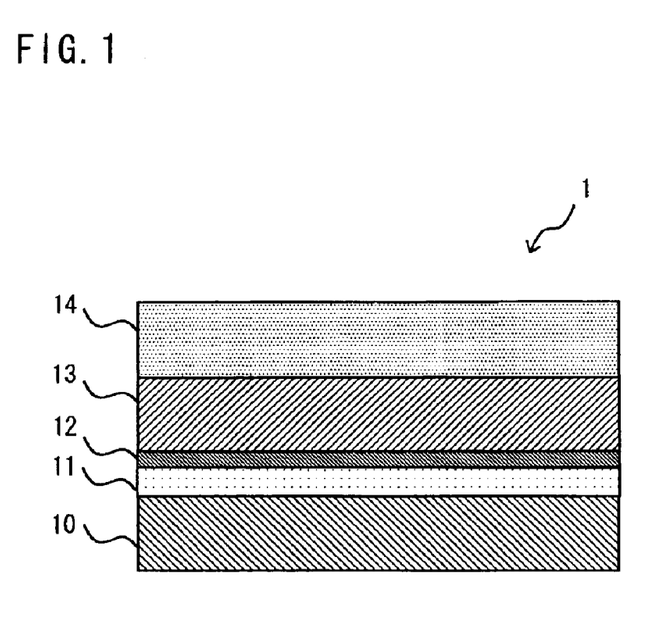
FIG. 1 shows the capacitor structure of memory according to a specific embodiment of the invention.

Next, referring to FIG. 1, a description will be given of a method of manufacturing a semiconductor storage device having capacitive elements 1 each comprising a dielectric layer, a lower electrode and an upper electrode as described above.

First, a lower electrode 10 is formed on a first inter-layer insulating film that has been provided on a semiconductor substrate on which active elements such as transistors have been formed. Here, for example a TiN film or a multi-layered film of Ti and TiN (e.g. a Ti/TiN/Ti multi-layered film) is formed as a barrier layer by sputtering, and then a conductive film of thickness approximately 100 nm comprising, for example, Ru for lower electrode 10 formation is formed thereon by sputtering or CVD. Patterning for forming the lower electrodes may be carried out after the formation of this conductive film, or patterning of the lower electrodes may be carried out at a time after this conductive film, a dielectric layer and a conductive film for upper electrode formation have been formed. Moreover, the lower electrodes are disposed so as to be electrically connected to plugs that are provided in the first inter-layer insulating film and are electrically connected to the active elements.

Next, an initial nucleus 11, a buffer layer 12 and a dielectric layer 13 are formed in this order using MOCVD in accordance with the method described earlier on the conductive film 10 for lower electrode formation or the patterned lower electrodes.

Next, a conductive film 14 of thickness approximately 100 nm comprising, for example, Ru for upper electrode formation is formed on the dielectric layer 13 by sputtering or CVD.

After that, using dry etching, the barrier film, the lower electrode conductive film 10, the dielectric layer 13 and the upper electrode conductive film 14 are patterned, or in the case that the lower electrodes have already been formed, the dielectric film 13, the upper electrode conductive film 14 and so on are patterned, whereby capacitive elements each having an upper electrode, a lower electrode, and a dielectric layer positioned between these electrodes are formed.

A second inter-layer insulating film is formed on the capacitive elements formed as described above, plugs that are electrically connected to the upper electrodes are formed in the second inter-layer insulating film, and then wiring that is electrically connected to these plugs can be formed.

EXAMPLES

The present invention will be described in further detail through examples.

Example 1

On a 100 nm-thick Ru film as a lower electrode conductive film, using raw materials as below with an MOCVD method as below, under conditions of a substrate temperature of 430° C. and a film formation pressure of 1 Torr (133 Pa), an initial nucleus (PTO, Ti/Pb atomic ratio=0.91), a buffer layer (PTO, Ti/Pb atomic ratio=0.63) and a ferroelectric film (PZT) were formed, and then a 100 nm-thick Au film was formed as an upper electrode using a vacuum deposition method.

Pb raw material: A solution of lead bis-dipivaloylmethanate ($Pb(DPM)_2$) dissolved in an organic solvent (concentration 0.1 mol/L)

Ti raw material: A solution of titanium diisopropoxy bis-dipivaloylmethanate ($Ti(OiPr)_2(DPM)_2$) dissolved in an organic solvent (concentration 0.3 mol/L)

Zr raw material: A solution of zirconium isopropoxy tris-dipivaloylmethanate ($Zr(OiPr)(DPM)_3$) dissolved in an organic solvent (concentration 0.1 mol/L)

Oxidizing gas: Nitrogen dioxide ($NO_2$)

The Pb raw material, the Ti raw material and the Zr raw material were transported as solutions, and then vaporized using a vaporizer and supplied into the vacuum vessel (i.e. were supplied using the so-called liquid transport method).

First, before forming the initial nucleus, together with 400 sccm of nitrogen dioxide, the Pb raw material (0.3 ml/min) was supplied for 5 seconds as a vaporized gas (pre-step), and then the Ti raw material (0.12 ml/min) was further supplied as a vaporized gas and this state was held for 20 seconds, thus forming a 3 nm-thick initial nucleus (crystalline nucleus) (first step).

Next, the system was held for 20 seconds with the same temperature, pressure, Pb raw material supply rate and nitrogen dioxide supply rate as in the first step but with the Ti raw material supply rate reduced to 0.06 ml/min, thus forming a 2 nm-thick buffer layer (second step).

Next, prescribed film formation conditions, namely a Pb raw material supply rate of 0.35 ml/min, a Ti raw material supply rate of 0.1 ml/min, and a Zr raw material supply rate of 0.21 ml/min, were changed to, and after stabilization, the solutions of these raw materials were made into vaporized gases, and the vaporized gases were supplied for 900 seconds together with 400 sccm of nitrogen dioxide, thus forming a 230 nm-thick ferroelectric film (third step).

The hysteresis characteristics for the capacitive element formed as described above are shown in FIG. 2A. It can be seen from this figure that, compared with the comparative example described later, the low voltage characteristic, i.e. the remanent polarization at low voltage, is improved.

Figure 2A:
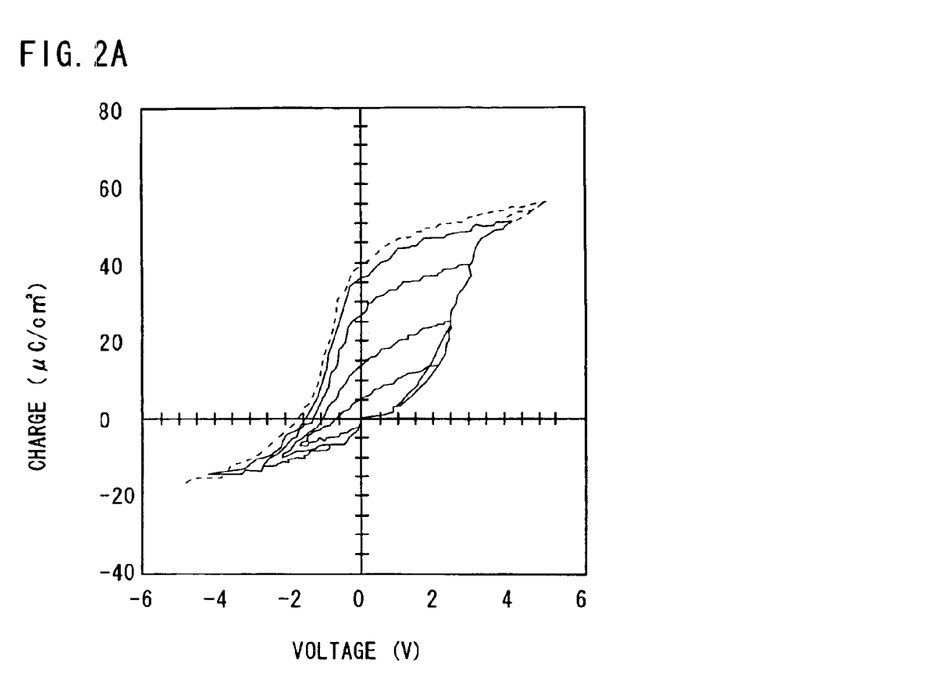
FIGS. 2A and 2B show the hysteresis characteristics for the capacitive element of an example and a comparative example, respectively.

Note that FIG. 2A shows on top of one another the hysteresis curves obtained for ±2 V, ±2.5 V, ±3 V, ±4 V and ±5 V bipolar single-shot voltage sweeps (single-shot hysteresis curves).

Example 2

Figure 3A:
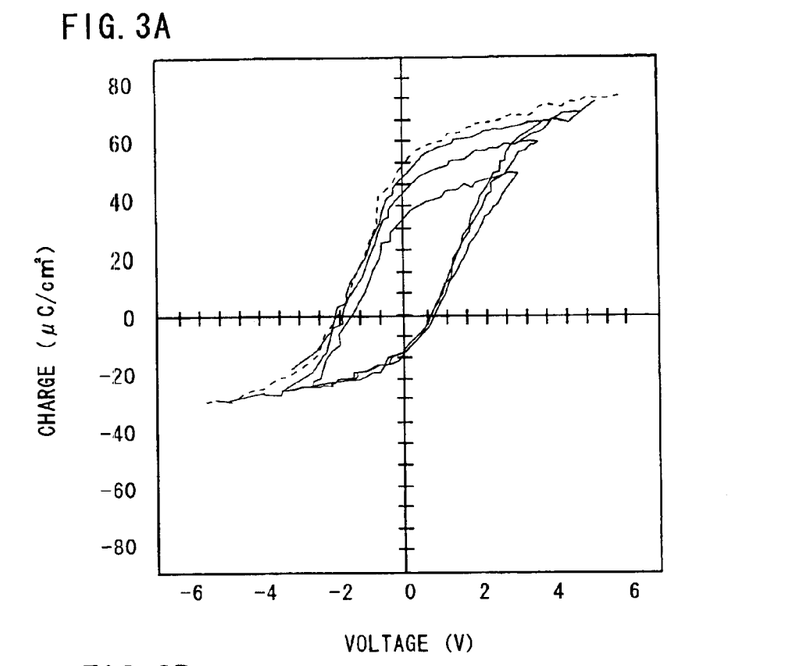
FIGS. 3A and 3B show the hysteresis characteristics for the capacitive element of an example and a comparative example, respectively.

A capacitive element was formed as in Example 1, except that an oxide of Ru was formed as the upper electrode. The hysteresis characteristics for the capacitive element formed are shown in FIG. 3A. It can be seen from this figure that, compared with the comparative example described later, the low voltage characteristic, i.e. the remanent polarization at low voltage, is improved.

Note that FIG. 3A shows on top of one another the hysteresis curves obtained for ±2.5 V, ±3 V, ±4 V and ±5 V bipolar single-shot voltage sweeps (single-shot hysteresis curves).

Example 3

On a 100 nm-thick Ru film as a lower electrode conductive film, using raw materials as below with an MOCVD method as below, an initial nucleus (PTO, Ti/Pb atomic ratio=1), a buffer layer (lead oxide, Ti/Pb atomic ratio=0) and a ferroelectric film (PZT) were formed, and then a 100 nm-thick Ru oxide film was formed as an upper electrode.

Pb raw material: Lead bis-dipivaloylmethanate ($Pb(DPM)_2$)

Ti raw material: Titanium isopropoxide ($Ti(OiPr)_4$)

Zr raw material: Zirconium butoxide ($Zr(OtBu)_4$)

Oxidizing gas: Nitrogen dioxide ($NO_2$)

The Pb raw material, the Ti raw material and the Zr raw material were vaporized directly from a solid or liquid as is and supplied into the vacuum vessel (i.e. were supplied using the so-called solid sublimation method).

First, before forming the initial nucleus, at a substrate temperature of 330° C. and a film formation pressure of 50 mTorr (6.65 Pa), together with 20 sccm of nitrogen dioxide, 0.18 sccm of the Pb raw material was supplied for 20 seconds (pre-step), and then at the same temperature and pressure the Ti raw material (0.24 sccm) was further supplied in and this state was held for 10 seconds, thus forming a 2 nm-thick initial nucleus (crystalline nucleus) (first step).

Next, the substrate temperature was changed to 430° C., and this state was held for 10 seconds with the same pressure, Pb raw material supply rate and nitrogen dioxide supply rate as in the first step, thus forming a 0.4 nm-thick buffer layer (second step).

Next, prescribed film formation conditions, namely a Pb raw material supply rate of 0.18 sccm, a Ti raw material supply rate of 0.14 sccm, a Zr raw material supply rate of 0.045 sccm, and a nitrogen dioxide supply rate of 50 sccm were changed to, and after stabilization, these raw materials were supplied for 1250 seconds, thus forming a 230 nm-thick ferroelectric layer (third step).

The hysteresis characteristics for the capacitive element formed as described above are shown in FIG. 4A. It can be seen from this figure that, compared with the comparative example described later, the low voltage characteristic, i.e. the remanent polarization at low voltage, is improved.

Figure 4A:
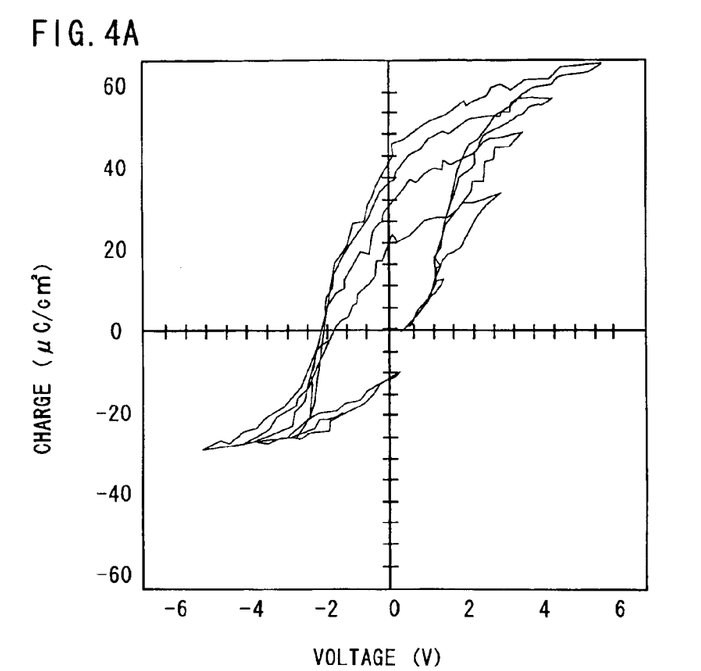
FIGS. 4A and 4B show the hysteresis characteristics for the capacitive element of an example and a comparative example, respectively.

Note that FIG. 4A shows on top of one another the hysteresis curves obtained for ±2.5 V, ±3 V, ±4 V and ±5 V bipolar single-shot voltage sweeps (single-shot hysteresis curves).

Comparative Example 1

Figure 2B:
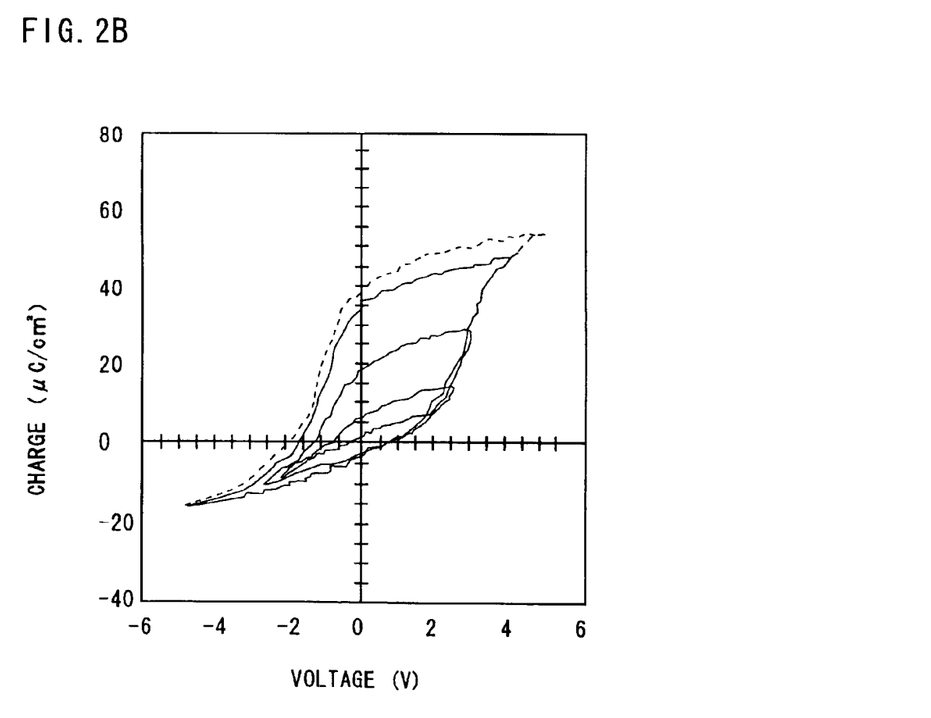

A capacitive element was produced as in Example 1, except that the second step was not carried out. The hysteresis characteristics for the capacitive element formed are shown in FIG. 2B.

Comparative Example 2

Figure 3B:
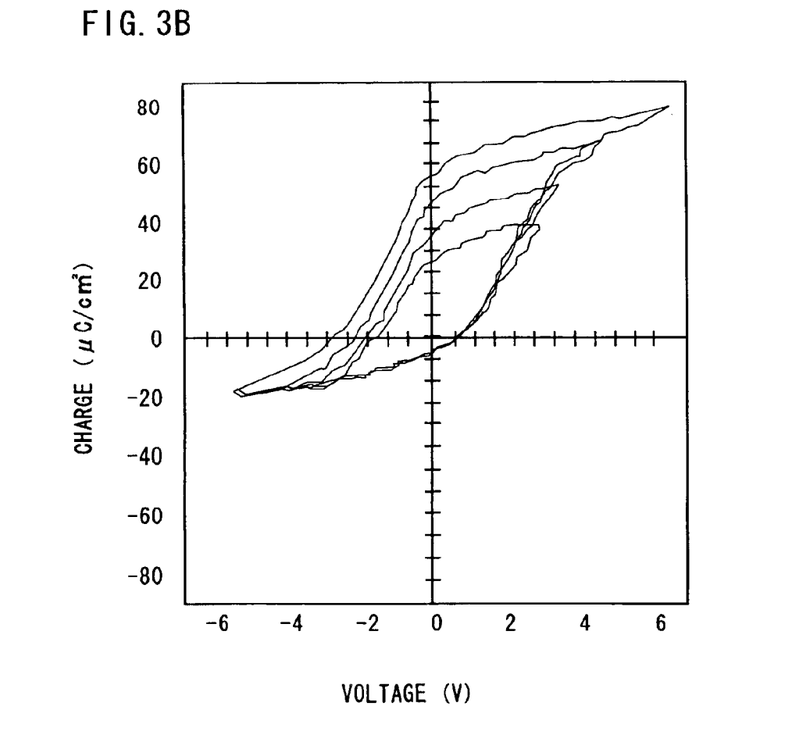

A capacitive element was produced as in Example 2, except that the second step was not carried out. The hysteresis characteristics for the capacitive element formed are shown in FIG. 3B.

Comparative Example 3

Figure 4B:
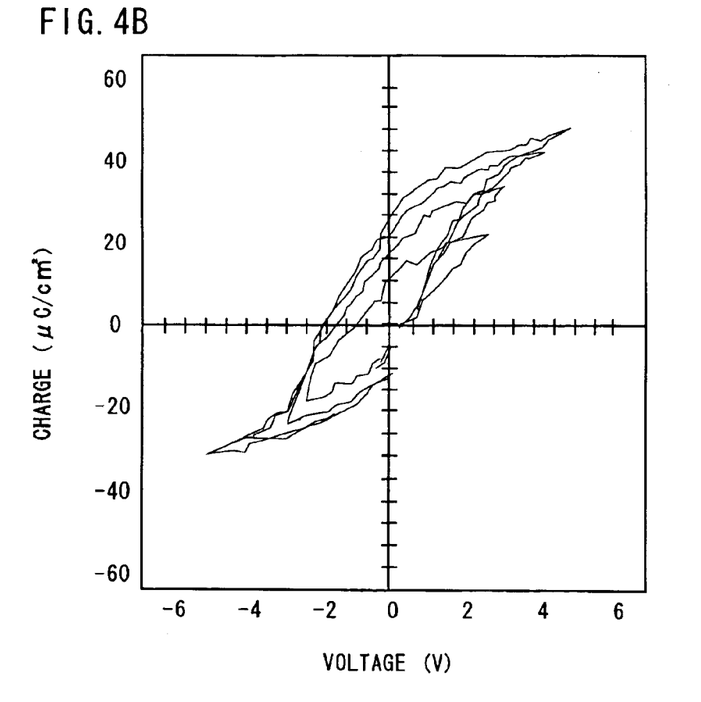

A capacitive element was produced as in Example 3, except that the second step was not carried out. The hysteresis characteristics for the capacitive element formed are shown in FIG. 4B.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor storage device having a capacitive element having a dielectric layer having a perovskite-type crystal structure represented by general formula $ABO_3$ and a lower electrode and an upper electrode disposed so as to sandwich the dielectric layer therebetween, the semiconductor storage device having:

on conductive layer constituting the lower electrode, an initial nucleus containing at least one metallic element the same as a metallic element in the dielectric layer; and between the initial nucleus and the dielectric layer, a buffer layer containing at least one metallic element the same as the metallic element contained in both the initial nucleus and the dielectric layer, in a higher content than the content of this metallic element contained in the initial nucleus.

2. The semiconductor storage device according to claim 1, wherein the buffer layer contains lead as the metallic element contained in a higher content than the content of the same contained in the initial nucleus.

3. The semiconductor storage device according to claim 1, wherein the buffer layer has a thickness in a range of 0.2 to 10 nm.

4. The semiconductor storage device according to claim 1, wherein the dielectric layer is a ferroelectric layer containing lead as an element A occupying the A lattice sites, and containing zirconium and titanium as elements B occupying the B lattice sites.

5. The semiconductor storage device according to claim 4, wherein the initial nucleus comprises lead titanate, and the buffer layer comprises a metal oxide containing lead.

6. The semiconductor storage device according to claim 5, wherein the buffer layer comprises lead titanate, and has a higher lead content than the lead content in the initial nucleus.

7. The semiconductor storage device according to claim 5, wherein the buffer layer comprises lead oxide.

8. The semiconductor storage device according to claim 1, wherein the lower electrode has, at least on a surface on the side of the dielectric layer, a film comprising at least one material selected from platinum, iridium, ruthenium, and oxides thereof.

9. The semiconductor storage device according to claim 1, wherein the upper electrode has, at least on a surface on the side of the dielectric layer, a film comprising at least one material selected from platinum, iridium, ruthenium, and oxides thereof.

* * * * *